(12) United States Patent
Catrysse et al.

(10) Patent No.: US 7,248,297 B2
(45) Date of Patent: Jul. 24, 2007

(54) INTEGRATED COLOR PIXEL (ICP)

(75) Inventors: Peter B. Catrysse, Palo Alto, CA (US);
Brian A. Wandell, Menlo Park, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 1228 days.

(21) Appl. No.: 09/999,592

(22) Filed: Nov. 30, 2001

(65) Prior Publication Data
US 2003/0103150 A1 Jun. 5, 2003

(51) Int. Cl.
*H04N 5/335* (2006.01)
*H01L 31/062* (2006.01)

(52) U.S. Cl. .................. 348/273; 348/272; 257/294
(58) Field of Classification Search ............ 348/272, 348/273; 250/208.1; 257/98, 292, 23
See application file for complete search history.

(56) References Cited

U.S. PATENT DOCUMENTS

| | | | |
|---|---|---|---|
| 3,971,065 A | 7/1976 | Bayer | 358/41 |
| 4,343,890 A * | 8/1982 | Phillips et al. | 430/321 |
| 4,772,951 A | 9/1988 | Saito | 358/213.11 |
| 5,479,524 A | 12/1995 | Farrell et al. | 382/162 |
| 5,521,640 A | 5/1996 | Prater | 348/273 |
| 5,734,155 A * | 3/1998 | Rostoker | 250/208.1 |
| 5,761,270 A * | 6/1998 | Unfors | 378/207 |
| 5,973,316 A | 10/1999 | Ebbesen et al. | 250/216 |
| 5,998,806 A | 12/1999 | Stiebig et al. | 257/55 |
| 6,040,936 A | 3/2000 | Kim et al. | 259/245 |
| 6,057,586 A | 5/2000 | Bawolek et al. | 257/435 |
| 6,091,093 A * | 7/2000 | Kang et al. | 257/292 |
| 6,097,145 A | 8/2000 | Kastalsky et al. | 313/466 |
| 6,235,549 B1 | 5/2001 | Bawolek et al. | 438/48 |
| 6,236,033 B1 | 5/2001 | Ebbesen et al. | 250/216 |
| 6,252,218 B1 | 6/2001 | Chou | 250/208.1 |
| 6,274,917 B1 | 8/2001 | Fan et al. | 257/432 |
| 6,289,139 B1 | 9/2001 | Chen et al. | 382/312 |
| 6,720,119 B2 * | 4/2004 | Ohtsu et al. | 430/7 |
| 6,934,050 B2 * | 8/2005 | Merrill et al. | 358/1.16 |
| 2001/0003047 A1 * | 6/2001 | Yamaguchi et al. | 438/1 |
| 2005/0162358 A1 * | 7/2005 | Song et al. | 345/88 |

OTHER PUBLICATIONS

Sitzungsber d.. Berl. Akad. d. Wiss.; "On electric radiation;" Dec. 13, 1888. Wiedemann's Ann. 36, p. 769.

George R. Bird et al.; "The wire grid as a near-infrared polarizer;" Journal of the Optical Society of America, vol. 50, No. 9, Sep. 1960.

M. A. Ordal et al.; "Optical properties of the metals Al, Co, Cu, Au, Fe, Pb, Ni, Pd, Pt, Ag, Ti, and W in the infrared and far infrared;" Applied Optics/vol. 22 No. 7/ Apr. 1, 1983.

(Continued)

*Primary Examiner*—Lin Ye
(74) *Attorney, Agent, or Firm*—Lumen Intellectual Property Services, Inc.

(57) ABSTRACT

An integrated color pixel (ICP) with at least one integrated metal filter is presented. Rather than utilizing a separate color filter, the wavelength responsivity of the ICP is specified and integrated at pixel level into the ICP itself using metal materials already available for standard integrated circuit design and fabrication process. The ICP of the present invention is thus distinguished from a conventional color pixel constructed in a two-stage process that combines an image sensor with a color filter array or other optical material.

20 Claims, 10 Drawing Sheets

OTHER PUBLICATIONS

R. H. Ritchie et al.; "Surface-plasmon resonance effect in grating diffraction;" Physical Review Letters, vol. 21, No. 22, Nov. 1968.

R. W. Wood; "Anomalous diffraction gratings;" Physical Review vol. 48, Dec. 15, 1935.

D. J. Gundlach et al.; "High-mobility, low voltage organic thin film transistors;" 1999 International Electron Devices Meeting Technical Digest, pp. 111-114, Dec. 1999.

J. L. Sanford et al.; "Silicon light-valve array chip for high resolution reflective liquid crystal projection displays;" IBM Jounal of Research and Development, vol. 42, No. 3/4 1998.

Nan M. Jokerst et al.; "Microsystem optoelectronic integration for mixed multisignal systems;" IDDD Journal on Elected Topic in Quantum Electronics, Vel 6, Nov./Dec. 2000.

John Ousterhout; "Magic tutorial #2; basic painting and selection;" Magic Tuttorial #2: Basic Painting and Selection, Sep. 19, 1990.

P. Mach et al.; "Monolithically integrated, flexible display of polymer-dispersed liquid crystal driven by rubber-stamped organic thin-film transistors;" Applied Physics Letters, vol. 78, No. 23, Jun. 4, 2001.

W. E. Howard et al.; "Microdisplys based upon organic light-emitting diodes;" IBM Journal of Research and Development, vol. 45, No. 1, 2001.

Tae Jin Kim et al.; "Control of optical transmission through metals perforated with subwavelength hole arrays;" Optics Letters/vol. 24, No. 4/Feb. 15, 1999.

H. F. Ghaemi et al.; "Surface plasmons enhance optical transmission through subwavelength holes;" Physical Review B, vol. 58, No. 11, Sep. 15, 1998-1.

T. W. Ebbesen; "Extraordinary Optical Transmission Through Sub-Wavelength Hole Arrays;" NATURE, vol. 391, pp. 667-669, Feb. 1998.

M. Bohm et al.; "High dynamic range image sensors in thin film on ASIC technology for automotive applications;" D. E. Ricken, W. Gessner, Advanced Microsystems for Automotive Applications, Springer-Verlag, Berlin, pp. 157-172, 1998.

Dawn Levy; "Speedy camera-on-a-chip both captures and processes images;" Stanford Report, Apr. 26, 2001.

Junko Yoshida; "Image sensor bring one-chip camera into view;" EETIMES, Monday Sep. 10, 2001.

"Integrated infrared- and visible-image sensors;" Nasa's Jet Propulsion Laboratory, Pasadena, California.

"Agilent CMOS image sensors HDCS-1020 (CIF) and HDCS-2020 (VGA)" Product Brief, Agilent Technologies.

Hans Lochbihler et al.; "Polarimetry of transmission gratings;" Sep. 1, 1995/vol. 34, No. 25/Applied Optics, 5725-5731.

Hans Lochbihler et al.; "Highly conducting wire gratings in the resonance region;" Jul. 1, 1993/vol. 32. No. 19/Applied Optics 3459.

Hans Lochbihler; "Surface polaritons on gold-wire gratings;" Phsical Review B vol. 50, No. 7, Aug. 15, 1994-I.

* cited by examiner (a)

(b)

(a)

(b)

(a)

(b)

(a) TFA pixel circuit  (b) ICP pixel circuit

INTEGRATED COLOR PIXEL (ICP)

BACKGROUND OF THE INVENTION

1. Field of the Invention

The present invention relates generally to a color image sensor and, more particularly, to an integrated color pixel (ICP) and a method of integrating control of wavelength responsivity into the ICP itself during a standard integrated circuit (IC) design and fabrication process.

2. Description of the Related Art

A basic image sensor captures an image in gray scale. That is, the image sensor, with its monochrome pixels, generally records the image in a series of tones ranging from pure white to pure black. A color image sensor captures the image in colors with monochrome pixels and color filters. The color filters are utilized for controlling the wavelength responsivity of the individual monochrome pixels. The wavelength transmittance of the color filters, along with the other optical elements, determine the wavelength responsivity of the color channels of the color image sensor.

A conventional way to integrate the color filters and hence the wavelength responsivity into the color image sensor is to utilize a color filter process in which a color filter array (CFA) comprising a regular array of differently colored filters is overlaid or deposited onto the monochrome pixels to separate out the colors of the light reflected from an image.

Color filter process in general and the CFA technology in particular are well known in the art and thus are not further described herein. An exemplary teaching on color filter process for semiconductor array imaging devices can be found in U.S. Pat. No. 6,274,917, which is by Fan et al. and assigned to Semiconductor Manufacturing Company (TSMC), Hsin-Chu, Taiwan.

The color filter pattern or patterned CFA of each color image sensor can be specifically designed to yield sharper images, truer colors, and/or any color effects desired. Most modern semiconductor image sensors, including complementary metal-oxide semiconductor (CMOS) and charge-coupled device (CCD) image sensors, utilize red, green, or blue (RGB) filters. Some image sensors in cameras use cyan, magenta, and yellow (CMYK) filters. The color patterns also vary from company to company with the most popular pattern being the Bayer mosaic pattern, taught by Bayer in U.S. Pat. No. 3,971,065 and assigned to Eastman Kodak Company, Rochester, N.Y.

Bayer teaches a sensing array for color imaging having individual luminance- and chrominance-sensitive elements that are so intermixed that each type of element, i.e., according to sensitivity characteristics, occurs in a repeated pattern with luminance elements dominating the array. In this case, filters selectively transmissive to light in the green region of the spectrum are utilized in producing luminance-sensitive elements, and red and blue transmitting filters are used for producing a first and second chrominance-sensitive elements. In other words, in Bayer, selectively sensitized elements, i.e., individual monochrome pixels with corresponding color filters overlaid thereupon, cooperating in interlaid sampling patterns control wavelength responsivity of the color imaging array. An exemplary Bayer mosaic pattern 100 is shown in FIG. 1(a). An exemplary application of the Bayer mosaic pattern 100 utilized in a conventional color pixel array 110 is shown in FIG. 1(b) where monochrome pixels 30 are overlaid with a CFA 34. As shown in FIG. 1(b), the CFA 34 is sandwiched between layers 33 and 35. Layers 33 and 35 can be specified as an anti-reflection layer and an insulation/protection layer, respectively. Layer 32 may comprise a variety of layers including additional metal layers for a variety of application-specific purposes.

As is well known in the art, one common problem associated with the use of CFA is that pixel and therefore the sensor sensitivity varies with the specific type of color. Several implementations have been proposed to enhance the pixel sensitivity. One such example can be found in U.S. Pat. No. 6,057,586, titled "Method and apparatus for employing a light shield to modulate pixel color responsivity" by Bawolek et al. and assigned to Intel Corporation of Santa Clara, Calif.

In Bawolek et al., a light shield is utilized to modulate/modify pixel sensitivity. According Bawolet et al., a pixel cell refers to a light sensing circuit and a CFA overlaid on top of a light sensor. The light sensor, as commonly understood, can be any means that receives and converts incident light into an electrical signal representative of that light. The pixel cell having a color filter array material of a first color disposed above the light sensor has a first relative sensitivity. A modulating light shield is disposed above the light sensor to modulate the pixel sensitivity. The light shield forms an aperture whose area is substantially equal to a light receiving area of the light sensor adjusted by a reduction factor. The reduction factor is the result of an arithmetic operation between the first relative sensitivity and a second relative sensitivity, associated with a second pixel of a second color. In Bawolet et al., the light shield, constructed using one of the pixel metal layers, and the CFA overlaid thereupon control sensitivity and wavelength responsivity of the pixel, respectively. Bawolet et al. particularly note that it is important that the other metal layers do not intrude into the non-covered optical path specified by the light shield layer. FIG. 2(a) shows a conventional color pixel array 200 having monochrome pixels 201 overlaid with a CFA 210 having a typical Bayer RGB pattern. FIG. 2(b) shows a modified color pixel array 220 comprising the monochrome pixels 201 overlaid with a light shield metal layer 202 and the CFA 210. The light shield metal layer 202 has a plurality of openings 203 where the area of the openings is specifically configured based on the color responsivity, i.e., red, green, or blue, of the pixel cell. The openings employed for controlling the pixel sensitivity can range from approximately one micron by one micron to 5 microns by 5 microns.

The various pixel implementations including the aforementioned pixel sensitivity modulation layer are to improve mostly CCD technology-based or CMOS technology-based image sensors. CCD image sensors have drawbacks well known in the art including limited on-chip signal processing capability and high power consumption. CMOS image sensors have been developed to overcome these drawbacks. The advantages of CMOS image sensors over CCD image sensors are well known in the art and thus are not described herein. CMOS image sensors utilizing CFAs, however, still have the following weaknesses.

A typical CFA may include multiple layers of superimposed color filters, which often cause a color "cross-talk" problem. Also, because the height of a pixel inversely affects the pixel's efficiency, the added height of these layers may cause a decrease in pixel efficiency.

What is more, as discussed heretofore, a typical CMOS color image sensor generally comprises a basic "monochrome" image sensor with color filters overlaid thereupon. The hybrid nature of CMOS image sensors and the color filter process lead to high fabrication costs and inflexibility in color image sensor design flow. Utilizing thin film technology, Böhm et al. proposed in "High Dynamic Range Image Sensors in Thin Film on ASIC Technology for Automotive Applications" Thin-Film-on-ASIC (TFA) image sensors to overcome the weaknesses of conventional CMOS color image sensors and to further reduce color image sensor manufacturing costs.

According to Böhm et al., a TFA image sensor is a vertically integrated image sensor where the optical detector of the sensor is deposited onto an ASIC wafer by a plasma enhanced chemical vapor deposition (PECVD) process in a cluster deposition system. ASIC wafer itself is fabricated using a standard 0.7 μm CMOS process.

Thin film technology provides a possibility of retaining the entire usual design flow and fabrication steps as employed for ASICs. As shown in FIG. 3(a), a typical TFA image sensor 300 consists of an amorphous silicon (a-Si:H) based optical detector 310 being deposited on top of a crystalline silicon (x-Si) ASIC 301 in a low temperature PECVD process. a-Si:H is an excellent material for optical detectors but not for electronic circuits. On the other hand, x-Si has poor photoelectric properties but a wide range of highly developed and abundantly available technologies for fabricating powerful integrated circuits.

FIG. 3(a) also shows the layer sequence of the typical TFA image sensor 300 where an insulation layer 320 separates the optical detector 310 from the ASIC 301. The insulation layer 320 is patterned in order to provide contact holes between the optical detector 310 and the circuitry of ASIC 301. Generally, there is one hole per pixel. The ASIC 301 typically includes identical pixel circuitry underneath each detector and peripheral circuitry outside the light sensitive area. The thin film system 340 is sandwiched between a metal rear electrode 330, which is usually the third metal layer of the ASIC 301, and a transparent front electrode 350. Due to its higher absorption coefficient and its maximum spectral response for green light, an amorphous silicon detector is better qualified for an image sensor than a crystalline silicon detector. This thin film deposition sequence is adaptable to the specific requirement of an application. For example, the a-Si:H thin film system 340 may comprise multiple layers. According to Böhm et al., at a thickness of less than 1 μm, the thin film system consists of four to seven successively deposited layers.

FIG. 3(b) illustrates how the TFA image sensor 300 is developed and fabricated. As shown in FIG. 3(b), the ASIC 301 and the optical detector 310 are separately developed in TFA image sensor design and fabrication process 311 so that the photoelectric properties of the detector can be optimized independent of the ASIC process. The ASIC 301 wafer is manufactured and the optical detector 310 including the a-Si:H thin film system 340 is subsequently deposited upon the ASIC 301. TFA image sensors are suited for automotive vision systems and are in development by Silicon Vision in cooperation with the Institute for Semiconductor Electronics (IHE) at the University of Siegen, both of Germany.

According to Böhm et al., one of the major benefits of the TFA technology is the possibility to deposit thin film detectors with adjustable spectral sensitivity on top of the ASIC. For a color sensor array, this leads to a 3-colors-in-one-pixel sensor design. The spectral response can be shifted varying the voltage applied to the pixel. FIG. 4(a) shows a pixel block diagram of the TFA color sensor array 400. The detector circuit 410 keeps the rear electrode at constant potential in order to suppress lateral balance currents. The photocurrent is fed into one of the color circuits 420, 430, 440, one at a time, during the integration phase. The TFA color sensor array 400 generates and stores the complete RGB information inside each pixel without intermediate readout operation. For readout, the integrated color voltages are sequentially applied to the column output line 450.

Wavelength responsivity of a TFA color pixel is controlled by the thin film being deposited thereupon a standard ASIC wafer. That is, the essential ability of controlling wavelength responsivity of a color image sensor is still dependent upon a separate and independent thin film process applied subsequent to standard semiconductor processing steps. What is more, pixels in the vertically integrated TFA image sensor having multiple layers deposited thereon may suffer from reduced pixel efficiency because of the increased overall height of the pixels.

What is needed, is a method of integrating control of wavelength responsivity into the pixel itself, generating a complete and highly integrated color pixel for quality color imaging using entirely standard semiconductor IC design and fabrication process, thereby solving a problem of color cross-talk in image sensors utilizing superimposed color filters and eliminating a need to subsequently applying a separate color filter process such as the thin film process, hence simplifying color image sensor design flow, further reducing color image sensor manufacturing cost, and potentially increasing pixel efficiency.

BRIEF SUMMARY OF THE INVENTION

Accordingly, it is a primary object of the present invention to integrate design of pixel and color filter yielding a novel integrated color pixel (ICP).

It is also an object of the present invention to utilize patterned metal layers and/or wires as wavelength selective (color) filter inside the pixel, thereby eliminating a need for additional color filter processing steps or thin films and hence reducing the overall height of the pixel.

It is yet another object of the present invention to provide an integrated color pixel that provides wavelength selection of light without color cross-talk.

It is a further object of the present invention to provide an integrated color pixel, comprising a pixel having a light sensitive element and at least one integrated metal filter, wherein the metal filter having an array of holes for selectively controlling light received by the light sensitive element of the pixel and wherein the metal filter being integrated into the pixel itself during a standard integrated circuit process.

Still another object of the present invention is to provide a method for integrating control of wavelength responsivity into a pixel itself, comprising the acts of specifying metal structures in at least one metal layer of the pixel during mask making stage of a standard semiconductor process, wherein the metal structures comprising metal materials readily available in and commonly used by the process and wherein the specifying act including spatially arranging the metal structures so as to form an array of holes manifesting a one- or two-dimensional pattern for controlling wavelength responsivity of the pixel.

Still further objects and advantages of the present invention will become apparent to one of ordinary skill in the art upon reading and understanding the following drawings and detailed description of the preferred embodiments. As it will be appreciated by one of ordinary skill in the art, the present invention may take various forms and may comprise various components and steps and arrangements thereof. Accordingly, the drawings are for purposes of illustrating a preferred embodiment(s) of the present invention and are not to be construed as limiting the present invention.

DETAILED DESCRIPTION OF THE INVENTION

Figure 1:
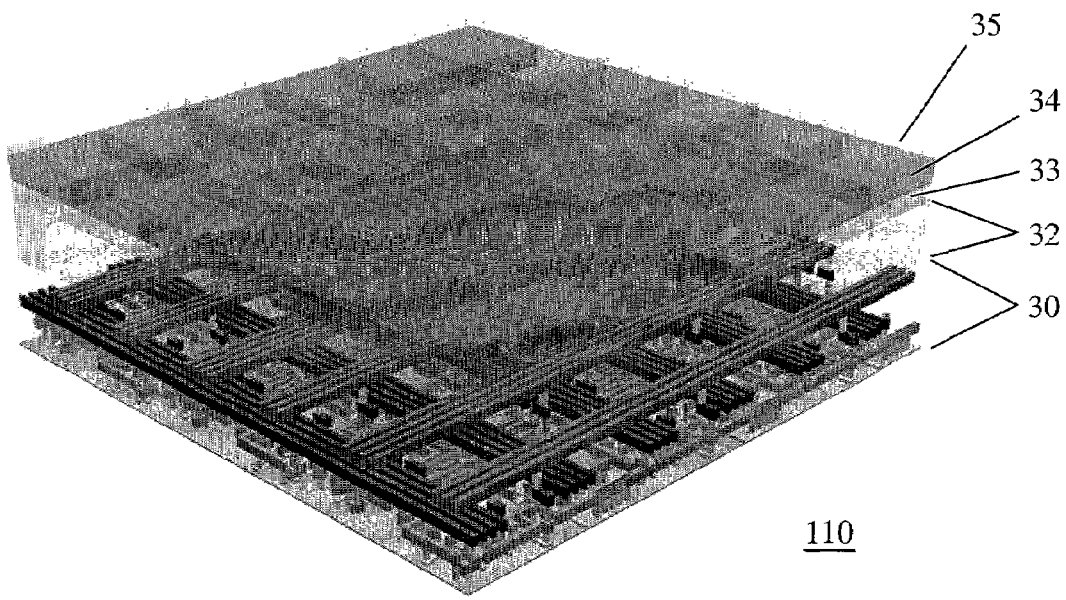
FIG. 1(a) shows a conventional CFA with Bayer mosaic pattern.
FIG. 1(b) is a three-dimensional view of a conventional color pixel model having a CFA overlaid on top of an array of monochrome pixels.
Figure 2:
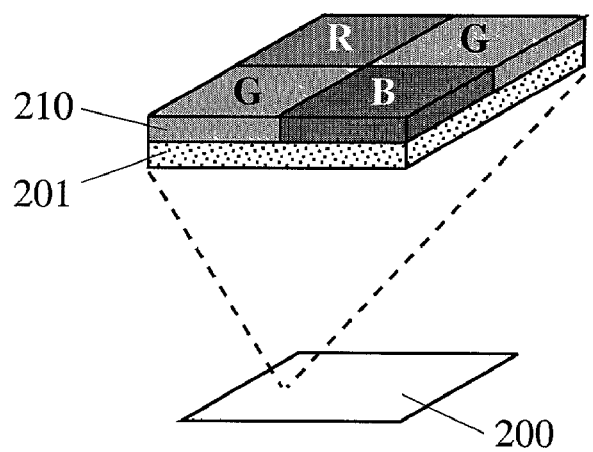
FIG. 2(a) shows a conventional color pixel array.
FIG. 2(b) shows a prior art implementation of a color pixel array with a light shield for modulating pixel sensitivity.
Figure 2:
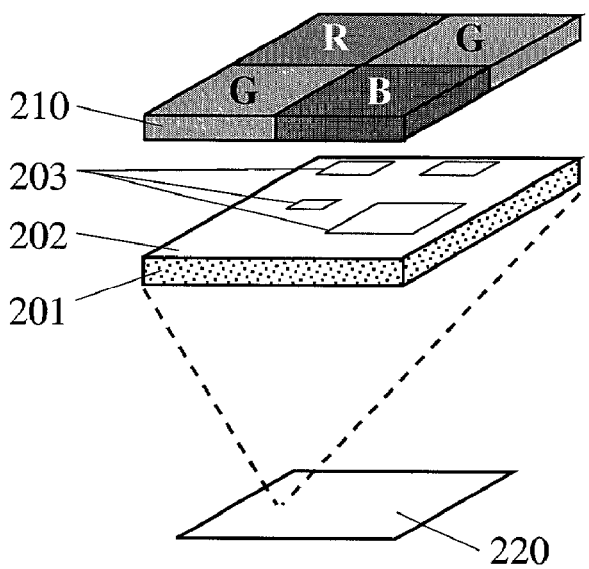
Figure 3:
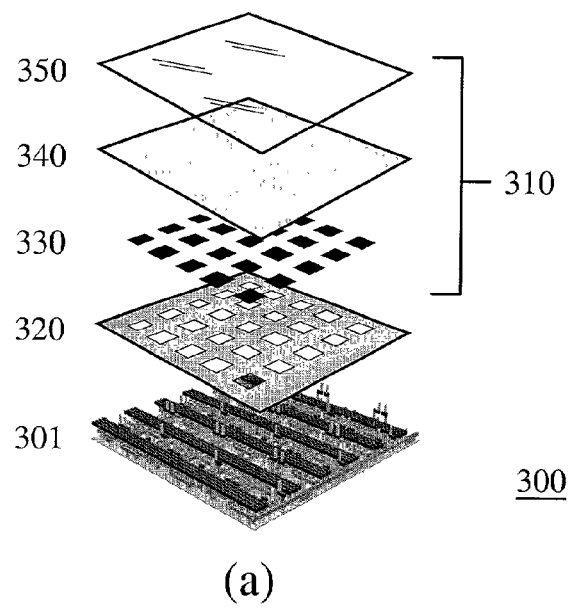
FIG. 3(a) illustrates the layer sequence of a TFA image sensor.
FIG. 3(b) is a block diagram showing a typical TFA image sensor design and fabrication process.
Figure 3:
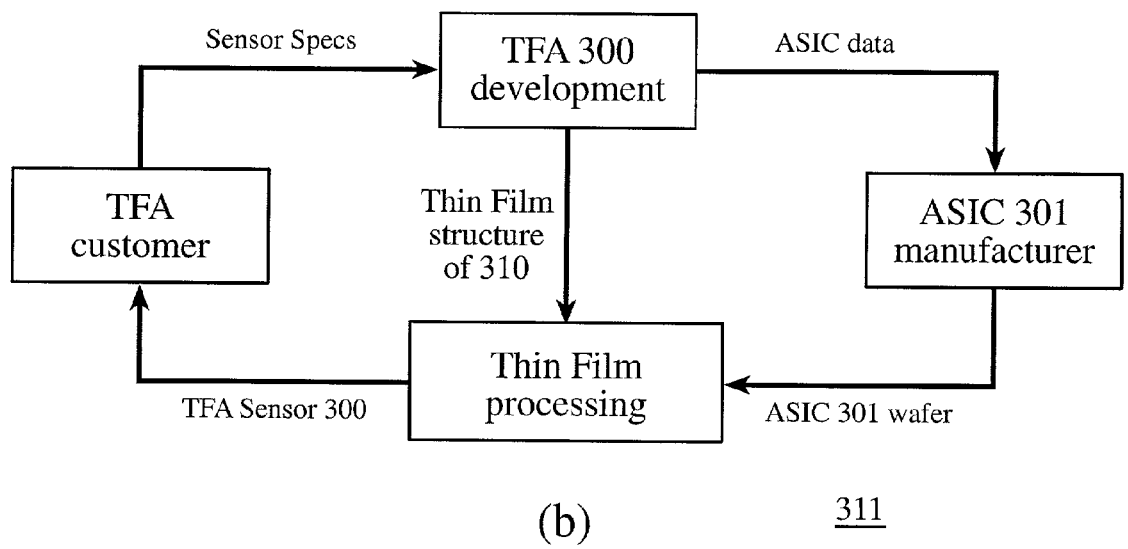

The present invention provides a method to control pixel wavelength responsivity during the standard integrated circuit (IC) design and manufacturing process. Rather than utilizing a separate color filter (dye-based, diffraction-based, thin film-based, etc.) the wavelength responsivity is controlled using materials that are integrated into the sensor design itself. That is, the inventive method solely utilizes the semiconductor process for making an ICP image sensor. An ICP of the present invention is thus distinguished from the aforementioned conventional color pixels that are constructed in at least two stages, combining a basic monochrome image sensor with a color filter array or other optical material.

As is well known in the art, a typical image sensor pixel comprises a light sensitive element (photodetector) that converts photons to electrons and internal circuitry that provides the pixel with desired functionality such as readout, signal conditioning, and so forth. In most manufacturing processes, the electrical connections between pixel components are routed through a series of metal layers that are between the imaging element of the system (lens) and the photodetector. Ordinarily, image sensor designers intuitively attempt to keep the opening, i.e., the light receiving area of the photodetector, between the photodetector and the lens, free of metal interconnects. Counter-intuitively, the ICP image sensor designers specify spatial arrangements of metal wires and/or layers, i.e., metal structures, in the light path from the lens to the photodetector so that the ICP itself controls the wavelength transmission to its photodetector.

By integrating control of wavelength responsivity into the pixel itself, the present invention simplifies the process of implementing a wavelength selective (color) pixel. As discussed heretofore, in conventional processing, overlaying a CFA on the image sensor pixels takes place subsequent to the semiconductor manufacturing process and thus requires a different set of tools, materials and processing steps. The present invention makes use of the tools, materials and processing steps already available and necessary to implement "monochrome" image sensor pixels and applies them to create an ICP. The ability to control wavelength responsivity in this way depends crucially on the ability to specify the width and position of the metal lines in the technology process.

Filters made from metal lines, wire-mesh or metallic grids, have been used extensively for filtering light in the far infrared (IR) spectrum, e.g. 10 to about 800 μm wavelengths. These filters comprise thin metallic wires (much thinner than the wavelengths to be transmitted) deposited on an optically clear support for selecting wavelength and polarization direction. Exemplary teachings on polarizing properties of wire gratings can be found in "Highly conducting wire gratings in the resonance region" by Lochbihler et al., "Surface polaritons on gold-wire gratings" by Lochbihler, and "Polarimetry of transmission gratings" by Lochbihler et al., which are hereby incorporated herein by reference. The filters are characterized by a wavelength transmittance having a peak at approximately 1.2 times the periodicity of the mesh. These filters would only be useful for visible imaging if this peak could be made in the visible range.

In modern manufacturing processes, the metal lines within the pixel are comparable or smaller than the wavelength of visible light (400 to 700 nm). At these scales, the metal layers are not as opaque to visible light as bulk metal, and variations in the pattern control the probability that incident light at a particular wavelength will influence the photodetector.

The likelihood of the incident light influencing the photodetector is governed by the optical properties of the metal wires and/or layers and the geometry of the patterns implemented. As such, one potential explanation of the physical mechanism for the wavelength selectivity is that providing the right pattern enables an incident wave front to stimulate a collective oscillation of the electrons on the front metal surface. These oscillations are commonly referred to as surface plasmons. Excitation of plasmons occurs because of momentum transfer from the light to the plasmon. The front surface plasmon can subsequently strongly couple with the back surface plasmon through the patterned apertures in the metal layers. At the back surface, a reverse momentum transfer process results in the emission of photons that are absorbed by the photodetector.

This surface-plasmon induced resonance phenomenon yields a peak transmittance, which occurs for a given wavelength depending on the type of metal, the dielectric surrounding and pattern geometry. Hence, the chance that a photon of a particular wavelength will influence the photodetector depends on the spatial pattern of on the metal layer and the wavelength of the photon. Exemplary teachings on surface-plasmon induced resonance phenomenon can be found in the following publications, which are hereby incorporated herein by reference and collectively referred to as Ebbesen hereinafter:
1. Ebbesen et al. "Extraordinary optical transmission through sub-wavelength hole arrays," Nature (London), February 1998, Vol. 391, pp. 667–669.
2. Ghaemi et al. "Surface plasmons enhance optical transmission through subwavelength holes", Physical Review B, The American Physical Society, September 1998, Vol. 58, No. 11, pp. 6779–6782.
3. Kim et al. "Control of optical transmission through metals perforated with subwavelength hole arrays", Optics Letters, Optical Society of America, February 1999, Vol. 24, No. 4, pp. 256–258.
4. U.S. Pat. No. 5,973,316, titled "Sub-wavelength aperture arrays with enhanced light transmission" by Ebbesen et al. and assigned to NEC Research Institute, Inc. of Princeton, N.J.
5. U.S. Pat. No. 6,040,936, titled "Optical transmission control apparatus utilizing metal films perforated with subwavelength-diameter holes" by Kim et al. and assigned to NEC Research Institute, Inc. of Princeton, N.J.
6. U.S. Pat. No. 6,236,033 B1, titled "Enhanced optical transmission apparatus utilizing metal films having apertures and periodic surface topography" by Ebbesen et al. and assigned to NEC Research Institute, Inc. of Princeton, N.J.

For decades, it has been thought that sub-wavelength apertures have very low light transmittance due to diffraction. Ebbesen's reports showed that a periodic array of holes in an optically thick metallic film exhibits extraordinary optical transmittance up to several orders of magnitude higher than small-hole diffraction theory predicts. As discussed before, such wavelength transmittance depends on the spatial arrangement, i.e., pattern, of the holes in the metal and the peak transmittance occurs at a given wavelength depending on the type of metal, the surrounding dielectric, and the geometry of the pattern.

An important application that motivated the present invention is the design of color filters for displays. Based on the principle of surface-plasmon induced resonance phenomenon disclosed by Ebbesen, it is possible to create thin films that control the wavelength transmittance along the light path, serving as a color filter. However, in Ebbesen, specially designed metal films are used. These metal films differ greatly from the metal layers available in CCD and CMOS technologies based color image sensors. What is more, integrating metal films into individual monochrome pixels is counter-intuitive to sensor design rules. This is because by standard design rules the light receiving area of the photodetector are not to be covered by any optically thick layers including metal layers.

Even if part of the light receiving area that is not in the optical path may be covered, the optical path itself, by standard design rules, should be free of any intrusion. That is, unlike the inventive ICP, a conventional sensor pixel does not allow metal layers intruding into the optical path of the photodetector. For example, in Bawolek et al., the metal layers and interconnect above and below the light modulating layer can intrude into the photodiode region, to the extent that the light modulating layer covers the predetermined light receiving area. As discussed herein, Bawolek et al. particularly note that it is important that the other metal layers do not intrude into the non-covered optical path (the modulation window or opening) through which the light enters the photodiode.

We have discovered that, notwithstanding standard sensor pixel design rules, it is possible to integrate control of the wavelength responsivity into the pixel design, taking advantage of the multiple metal layers present in a standard integrated circuit such as a CMOS image sensor. The present invention thus significantly extends the application of the surface-plasmon induced resonance phenomenon from thin films to the design of a complete integrated optical detector circuit.

Specifically, during the design process, e.g., during standard mask preparation, one can use the ability to specify metal structures in the layers above the photodetector, for example, a photodiode, to control the relative wavelength responsivity. By appropriately choosing/designing the metal structures, each ICP of the present invention has its own wavelength responsivity and/or wavelength transmittance and the image sensor can serve as part of a color imaging system. In this novel application, the intrinsic properties of the integrated circuit are used instead of thin film technology. Note that the use of a metal layer to control the wavelength transmittance and/or wavelength responsivity does not preclude that metal layer for use as an interconnect.

In an exemplary embodiment of the present invention, an ICP is implemented using a standard 0.18 µm technology CMOS process. At 0.18 µm, design rules begin to enable sub-visible wavelength features on metal layers. For example, metal wire width and spacing finer than 270 nm are now possible. Additionally, using the 0.18 µm CMOS technology, the spatial scale of the metal lines has reached the level necessary to control wavelength transmittance in the visible range (400 to 700 nm). Feature sizes allowed by the 0.18 µm CMOS process design rules for the metal layers enable reduction to practice of controllable wavelength-responsivity in the visible spectrum. Accordingly, implementations of CMOS image sensors utilizing the inventive ICP require feature sizes only possible in 0.18 µm or more advanced CMOS technology. On the other hand, it will be understood to those of ordinary skill in the art that the present invention is not limited to CMOS image sensors but can also be applied to other image sensors including CCD based image sensors. It will also be understood to those of ordinary skill in the art that the principles of the present invention can be utilized to control transmission of longer wavelength signals, e.g., infrared (IR), using technologies such as 0.35 µm and 0.5 µM, providing, for example, an integrated IR image sensor.

Figure 4:
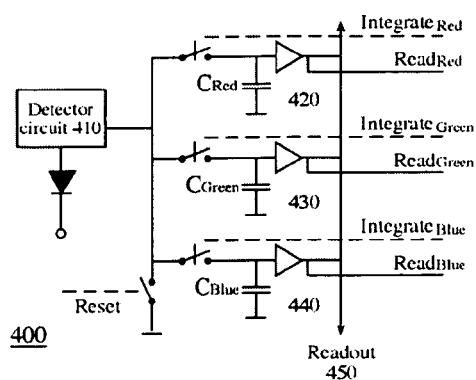
FIG. 4(a) illustrates a TFA color pixel circuit.
FIG. 4(b) illustrates an ICP circuit comprising an APS pixel and a 2-stage follower amplifier according to an embodiment of the present invention.
Figure 4:
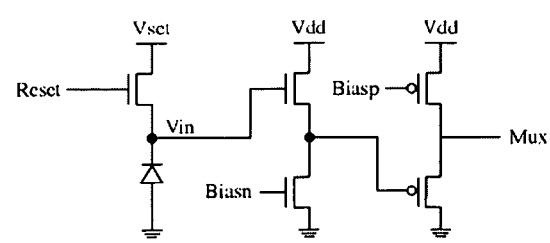

An ICP circuit schematic according to an embodiment of the present invention is shown in FIG. 4(b). In FIG. 4(b), a standard Active Pixel Sensor (APS) circuit is used. The output of the ICP is directly connected to a chip output via a follower amplifier. 3.3V thick oxide transistors are used to reduce transistor gate leakage and to increase voltage swing. The circuit operation of the ICP is otherwise standard and will not be further described herein.

Figure 5:
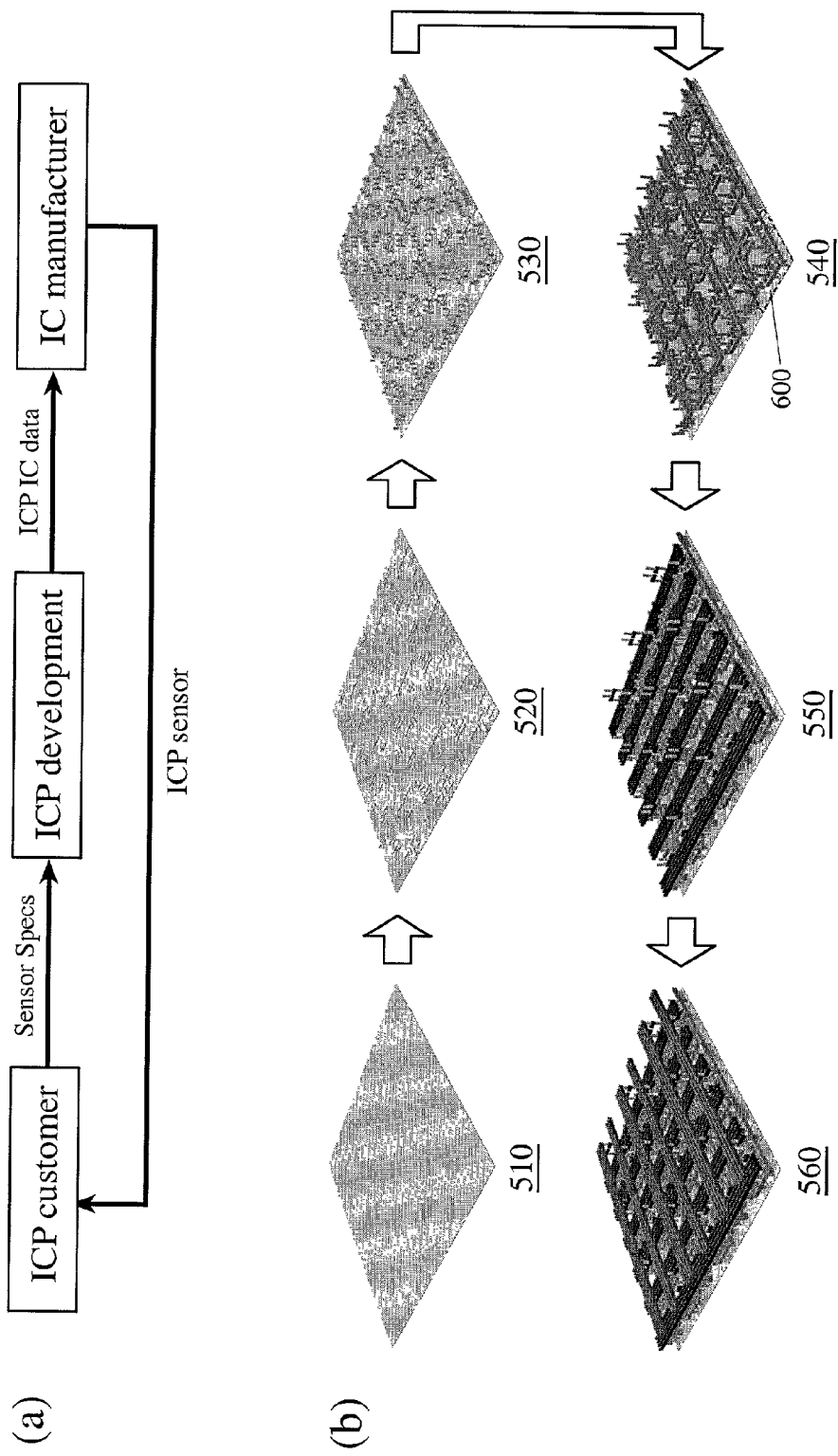
FIG. 5(a) is a block diagram showing an ICP image sensor design and fabrication process according to an aspect of the present invention.
FIG. 5(b) illustrates standard semiconductor processing steps during which the inventive ICP is implemented according to an embodiment of the present invention.

FIG. 5(a) shows a design flow in which an ICP image sensor is developed and constructed. As illustrated in FIG. 5(a), by controlling wavelength responsivity in the pixel design process, ICPs of the present invention do not need a separate color filter process such as a thin film process. FIG. 5(b) shows a standard pixel design process during which the individual ICPs are implemented. As illustrated in FIG. 5(b), a light sensitive substrate is provided in step 510. Subsequently, in steps 520, 530, 540, 550, and 560, layers poly, vias, metal-1, metal-2, and metal-3 are sequentially overlaid on top of each other. Layout of pixel 600 is presented in FIG. 6. Standard integrated circuit design and fabrication process is well known in the art and thus is not further described here.

Figure 6:
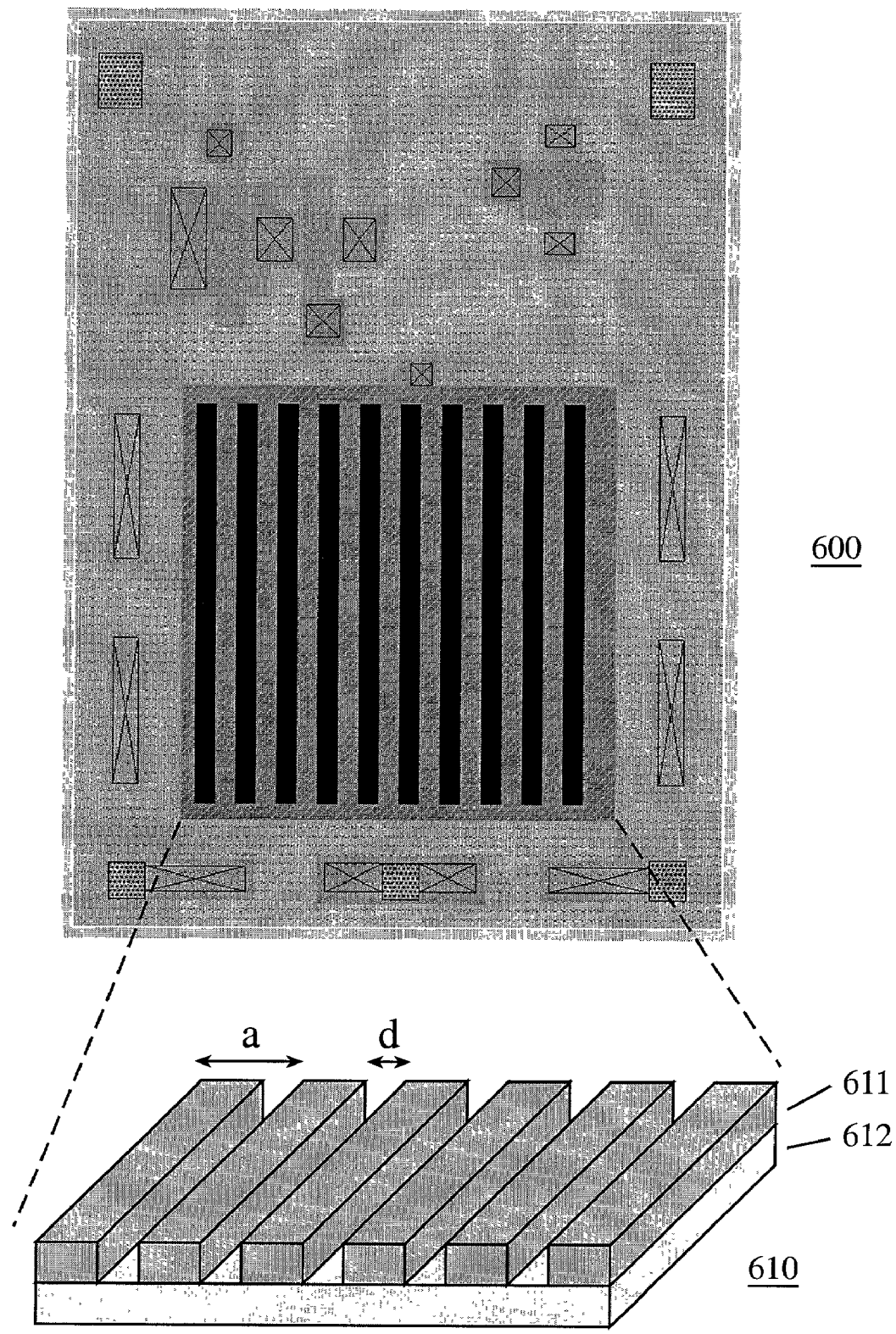
FIG. 6 illustrates an ICP layout showing one-dimensional (1D) metal pattern, integrated using metal-1 layer material, with period a and hole size d according to an embodiment of the present invention.

FIG. 6 illustrates an ICP layout 600 having a light sensitive area 610. According to an embodiment of the present invention, in the light sensitive area 610 a photodetector 612 is overlaid with metal structures 611. As shown in FIG. 6, the metal structures 611, positioned directly above and in the optical path of the photodetector 612, manifests an one-dimensional (1D) metal pattern with period a and hole size d. The metal structures 611 thus operate as a patterned metal filter. This patterned metal filter 611 controls the wavelength responsivity of the ICP 600 and is integrated into the ICP 600 itself during standard semiconductor manufacturing process using existing metal materials thereof, e.g., metal-1 layer. As it will be understood by one of ordinary skill in the art, the patterned metal filter 611 is not limited to using metal-1 layer material and may comprise a plurality of metal layers.

Figure 7:
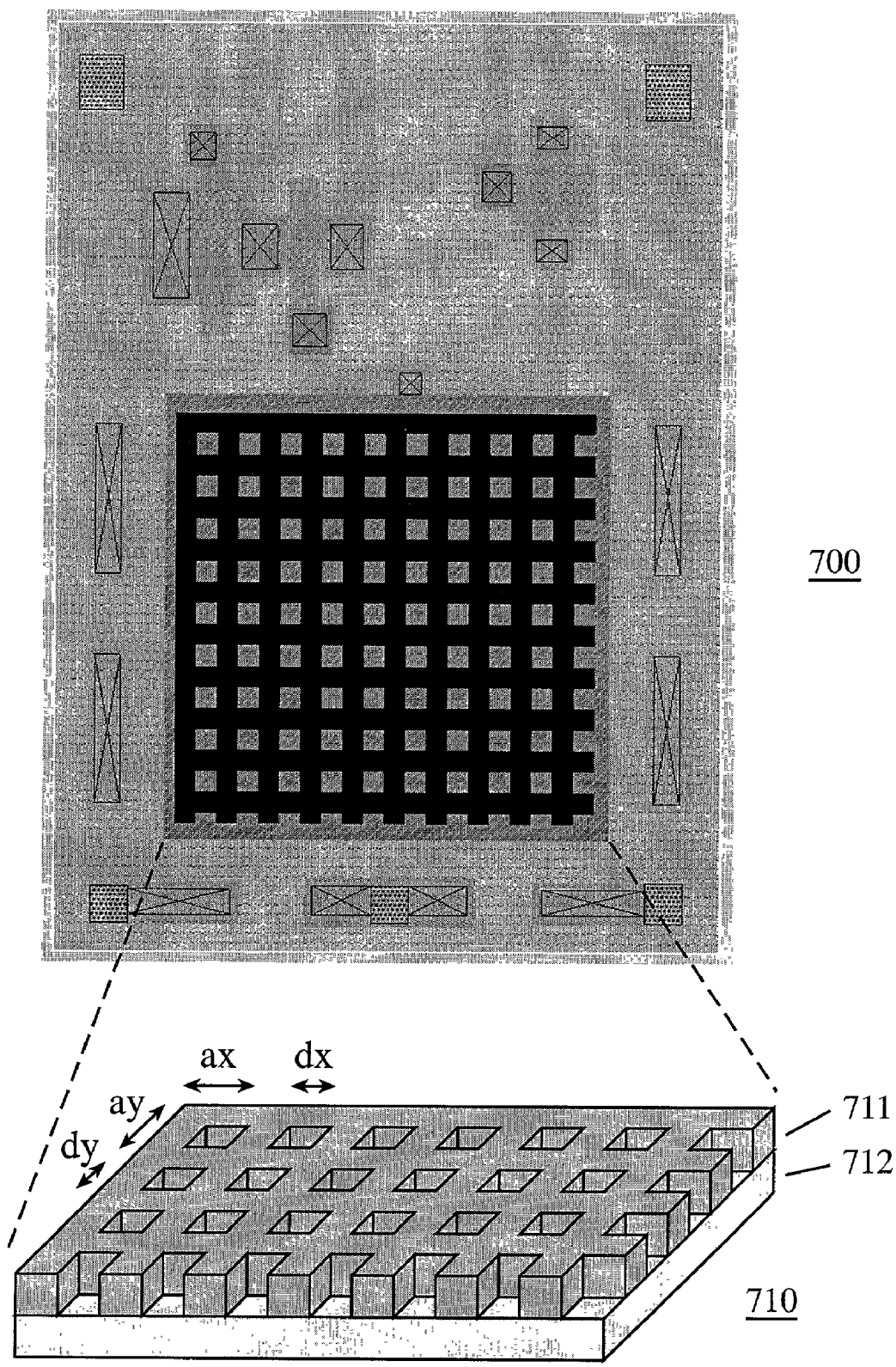
FIG. 7 shows another ICP layout with two-dimensional (2D) metal pattern having period ax, ay and hole size dx, dy, according to an embodiment of the present invention.

FIG. 7 shows another ICP layout 700 having a light sensitive area 710. Similar to the ICP layout 600, in the light sensitive area 710 a photodetector 712 is overlaid with metal structures 711. As shown in FIG. 7, the metal structures 711, i.e., the patterned metal filter 711, are positioned on top and in the optical path of the photodetector 712. The patterned metal filter 711 manifests a two-dimensional (2D) metal pattern having period ax, ay and hole size dx, dy. This patterned metal filter 711 controls the wavelength responsivity of the ICP 700 and is also integrated into the ICP 700 during standard integrated circuit process.

Figure 8:
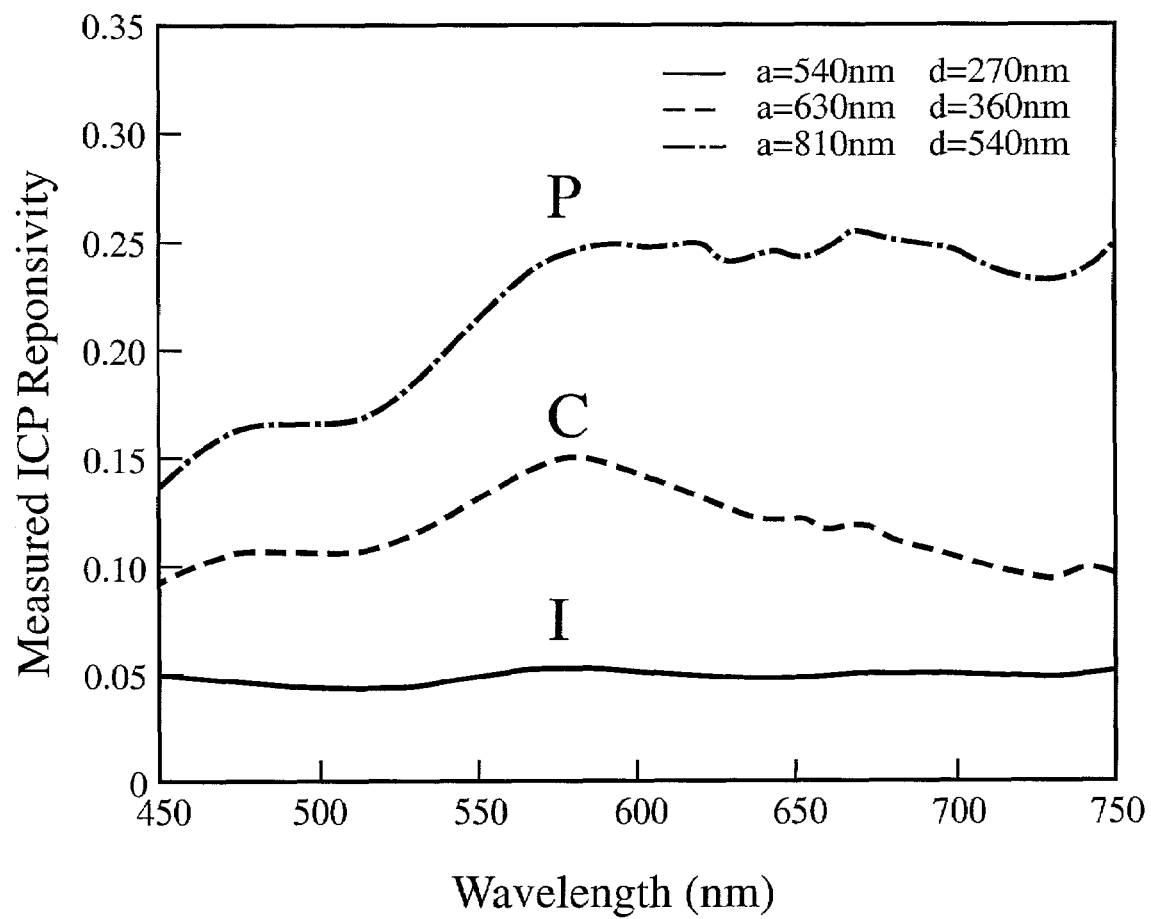
FIG. 8 shows measured ICP responsivities normalized with respect to peak photodiode response, wherein the ICP having a 2D metal pattern integrated using metal 1 layer material in accordance with an aspect of the present invention.

In another embodiment of the present invention, several 1D and 2D metal patterns with periodicity ranging from a=540 nm to 810 nm and spacing from d=270 nm to 540 nm and using different metal layers were deposited on top of APS photodetectors of 6 and 12 μm ICPs with n+/pwell photodiodes, respectively. FIG. 8 shows measured ICP wavelength responsivities normalized with respect to peak photodiode response, wherein the ICP having a 2D metal pattern integrated using metal-1 layer material in accordance with an aspect of the present invention. Note that the measured responsivities of 0.05, 0.15, and 0.25 are less than 50% lower than the respective fractions of uncovered photodiode areas even though hole sizes are smaller or equal to the wavelength.

Figure 9:
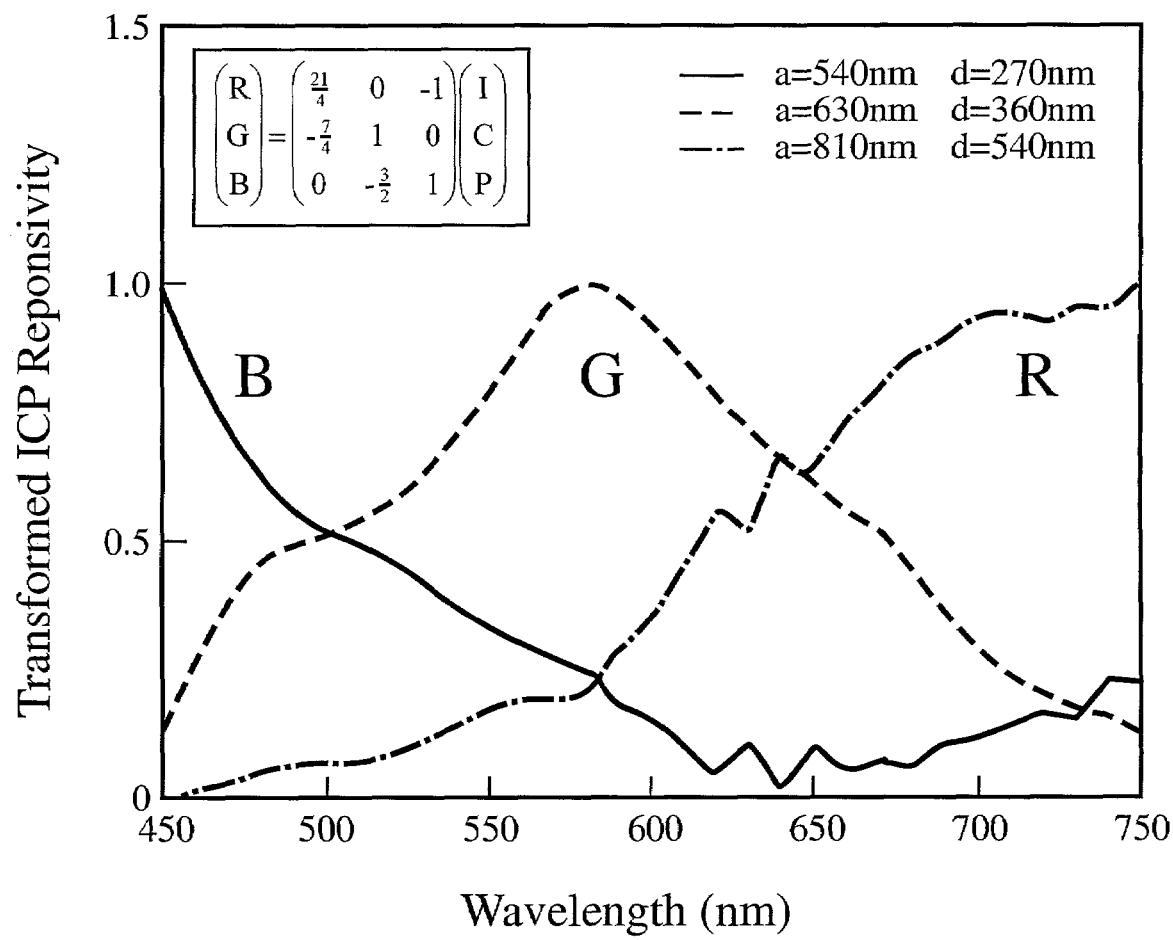
FIG. 9 shows transformed and normalized ICP responsivities of FIG. 8.

FIG. 9 shows the ICP responsivities of FIG. 8 after applying a linear transformation using an appropriate 3×3 matrix. Such linear transformation is well known in the art and thus is not further described herein. The transformed responsivities clearly demonstrate that the 2D metal-1 patterned ICPs exhibit RGB color pixel behavior peaking at 450 nm, 575 nm and 750 nm.

Figure 10:
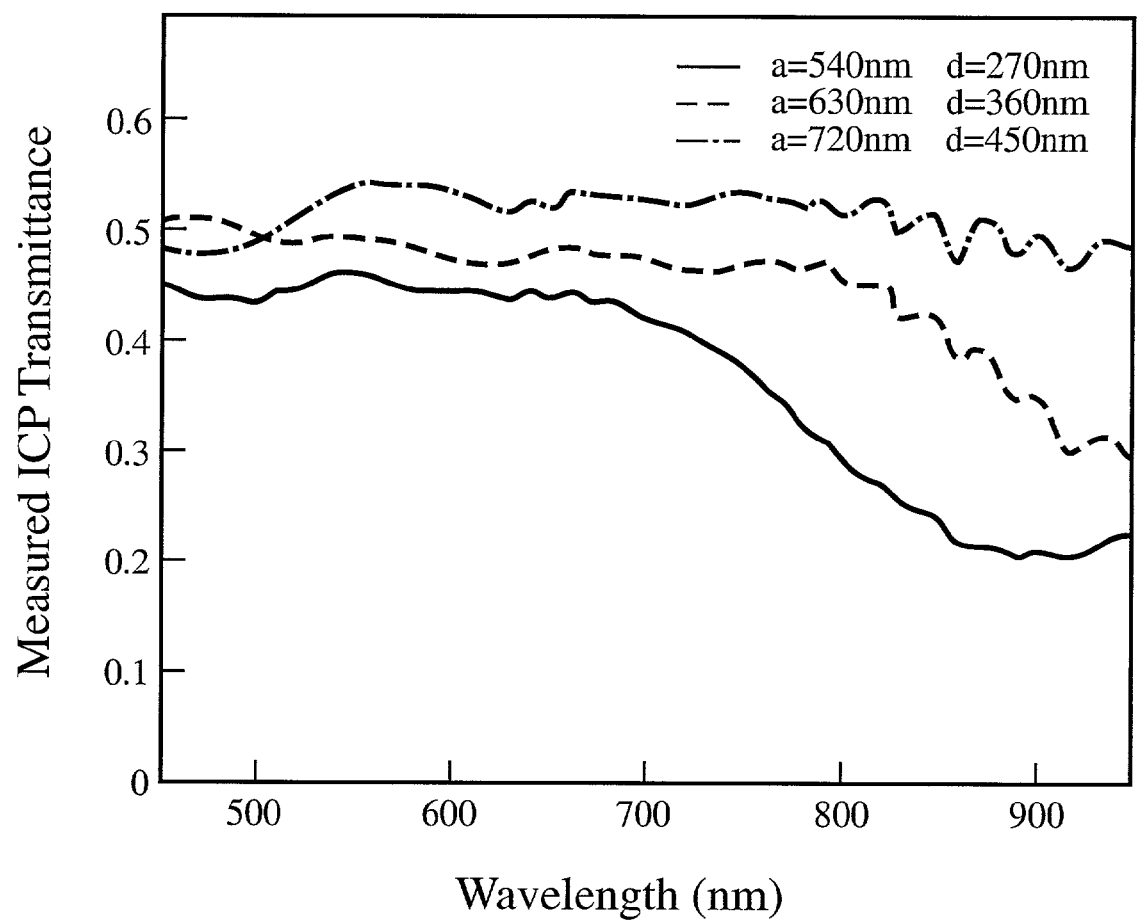
FIG. 10 shows measured ICP transmittances, wherein the ICP having a 1D metal pattern integrated using metal 1 layer material in accordance with an aspect of the present invention.

FIG. 10 shows measured ICP transmittances, wherein the ICP having a 1D metal pattern integrated using metal-1 layer material in accordance with an aspect of the present invention. Note that the transmittances in the visible wavelength range are around 0.50, which is slightly higher than the 0.47 fraction of uncovered photodiode area, i.e., hole area. It is observed that high transmittance 1D metal-1 patterns exhibit significant wavelength selectivity in the near-infrared wavelength range as well.

Accordingly, it has been demonstrated that placing metal patterns on top of a photodetector can significantly influence its wavelength responsivity. Further, as evidenced by these ICP responsivity measurements, with additional signal processing one can obtain responsivities that are suitable for color imaging. As will be understood by one with ordinary skill in the art, the inventive ICP may have patterns other than what have been shown and described in the present invention. Note 1D metal-1 patterns may have high transmittance but little or no selectivity in the visible wavelength range, while 2D metal-1 patterns may have high selectivity but low transmittance. This design tradeoff is observed between the 1D metal-1 pattern of FIG. 6 and the 2D metal-1 pattern of FIG. 7. Thus, depending upon design specifications, 1D patterns, 2D patterns, or a combination thereof may be utilized by the inventive ICP's integrated metal filter (metal structures constructed over the photodetector using a single or multiple metal layer materials) to control wavelength responsivity and/or wavelength transmittance of the ICP. Furthermore, it is anticipated that, with more advanced processes providing finer metal width, spacing, and thickness, patterned metal filters allowing both high wavelength transmittance and visible wavelength responsivity will become possible, making the inventive ICP approach a potentially attractive and viable lower cost alternative to conventional color pixels constructed with a two-stage manufacturing process, i.e., a combination of image sensor process and color filter process. Accordingly, ICPs of the present invention may eventually be implemented in virtually all apparatuses and systems where color pixels are utilized, including a color image sensor of a digital camera, a diagnostic camera, a scanner, or a communication device.

In conclusion, the integration of pixel design and color filter yields a novel integrated color pixel (ICP). Using metal materials, e.g., metal layers and/or wires, already available for standard semiconductor process to specify and fabricate an integrated wavelength selective (color) filter inside the pixel enables the elimination of additional color filter processing steps or thin films. As such, the overall height of the pixel is reduced and hence potentially increases pixel efficiency. The ICP also avoids color cross-talk since the color filter is integrated and not superimposed.

Although the present invention and its advantages have been described in detail, it should be understood that various changes, substitutions, and alternations could be made herein without departing from the principle and the scope of the invention. For example, different available metal layers may be utilized. The metal layer(s) may comprise different 1D and 2D patterns. In addition, multiple patterned metal layers may be used in sequence. The grating may be non-square and multiple gratings may be combined together, i.e., superposition of different k-vectors. In some embodiments, the ICP may be implemented with metal coating placed on micro lenses, diffraction gratings or other curved surfaces. In other embodiments, the ICPs may be combined with color filter arrays for other desired color effects. What is more, although approximately ninety percent of the layers that can be controlled during the design stage are metal layers, there are non-metal layers that a sensor designer might be able to have some, probably more restricted, control. Therefore, it is anticipated that patterns on any of the layers, including metal and non-metal ones, used in the standard integrated circuit process may be utilized to control the pixel's wavelength transmittance and wavelength responsivity.

Accordingly, the scope of the present invention should be determined by the following claims and their legal equivalents.

We claim:

1. An integrated color pixel (ICP), comprising: a pixel having a light sensing means and at least one filter means, wherein said filter means comprising a patterned metal filter having an array of holes for selectively controlling wavelength transmittance and wavelength responsivity and wherein said filter means being integrated into said pixel during an industry-standard integrated circuit (IC) process thereby eliminating a need to obtain a separate color filter means subsequent to said IC process.

2. The ICP of claim 1, wherein said light sensing means comprising a photodetector with a light receiving area and wherein said filter means being positioned on top of said light receiving area.

3. The ICP of claim 1, wherein said filter means being part of at least one metal layer above said light sensing means.

4. The ICP of claim 1, wherein said filter means comprising materials used by said IC process and wherein said array of holes manifesting a one- or two-dimensional pattern.

5. The ICP of claim 4, wherein said materials comprising metal wires spatially arranged to form said pattern on top of said light sensing means.

6. The ICP of claim 4, wherein said materials comprising metal structures spatially arranged to form said pattern, said spatial arrangement being specified during industry-standard mask preparation of said IC process.

7. The ICP of claim 1, wherein said array of holes manifesting a one- or two-dimensional pattern.

8. The ICP of claim 1, wherein said process being a complementary metal-oxide semiconductor (CMOS) process.

9. The ICP of claim 1, wherein said process being a charge-coupled device (CCD) process.

10. The ICP of claim 1, wherein said ICP is implemented in a color image sensor of a color imaging device including a digital camera, a diagnostic camera, a scanner, or a image recorder.

11. A method for integrating a color filter into a pixel having at least one metal layer and a light sensing means, comprising: specifying, during an industry-standard integrated circuit (IC) process and notwithstanding design rules of said process, a array of holes spatially arranged in said metal layer above said light sensing means for selectively controlling wavelength detected by said light sensing means; and fabricating said metal layer and said pixel substantially simultaneously during said IC process thereby generating an integrated color pixel (ICP) without a subsequent color filter process.

12. The method of claim 11, wherein said at least one metal layer comprising metal materials used by said IC process, wherein said light sensing means comprising a photodetector and wherein said array of holes manifesting a one- or two-dimensional pattern on top of said light receiving area.

13. The method of claim 12, wherein said metal material comprising metal wires spatially arranged to form said pattern.

14. The method of claim 12, wherein said metal material comprising metal structures spatially arranged to form said pattern, said spatial arrangement being specified using industry-standard photo-masking preparation software during said IC process.

15. The method of claim 11, wherein said light sensing means comprising a photodetector with a light receiving area and wherein said metal filter means being positioned above said light receiving area.

16. The method of claim 11, wherein said IC process being a complementary metal-oxide semiconductor (CMOS) process.

17. The method of claim 11, wherein said IC process being a charge-coupled device (CCD) process.

18. A method for generating an integrated color image sensor, comprising: controlling wavelength transmittance and wavelength responsivities of said integrated color image sensor by specifying metal structures of said sensor during a standardized image sensor design stage of a standardized image sensor fabrication process, wherein said metal structures comprising metal materials used by said process and wherein said specifying act further comprising spatially arranging said metal structures so as to form an array of holes manifesting a one- or two-dimensional pattern for enabling said controlling act.

19. The method of claim 18, further comprising: fabricating said metal structures and said integrated color image sensor substantially simultaneously during said process thereby eliminating a need to obtain a separate color filter for said sensor subsequent to said process.

20. The method of claim 18, wherein said integrated color image sensor comprising a photodetector with a light receiving area and wherein said metal structures being positioned on top of said light receiving area.

* * * * *